United States Patent [19]
Okino

[11] Patent Number: 5,879,842
[45] Date of Patent: Mar. 9, 1999

[54] PATTERN PROJECTION METHOD WITH CHARGED PARTICLE BEAM UTILIZING CONTINUOUS MOVEMENT OF MASK AND SUBSTRATE

[75] Inventor: Teruaki Okino, Kamakura, Japan

[73] Assignee: Nikon Corporation, Tokyo, Japan

[21] Appl. No.: 917,716

[22] Filed: Aug. 27, 1997

Related U.S. Application Data

[62] Division of Ser. No. 696,050, Aug. 13, 1996.

[30] Foreign Application Priority Data

Aug. 14, 1995 [JP] Japan .................................. 7-207193
Jul. 18, 1996 [JP] Japan .................................. 8-189463

[51] Int. Cl.$^6$ ........................................................ G06F 9/00
[52] U.S. Cl. ................................. 430/22; 430/30; 430/296
[58] Field of Search ............................... 430/22, 30, 296

[56] References Cited

U.S. PATENT DOCUMENTS

| | | | |
|---|---|---|---|
| 5,079,112 | 1/1992 | Berger | 430/4 |
| 5,130,213 | 7/1992 | Berger | 430/4 |
| 5,166,888 | 11/1992 | Engelke | 364/491 |
| 5,258,246 | 11/1993 | Berger | 430/4 |
| 5,260,151 | 11/1993 | Berger | 430/5 |
| 5,279,925 | 1/1994 | Berger | 430/246 |

FOREIGN PATENT DOCUMENTS 07183191  7/1995  Japan .

*Primary Examiner*—Christopher G. Young
*Attorney, Agent, or Firm*—Pillsbury Madison & Sutro LLP

[57] ABSTRACT

By causing a mask and a wafer to continuously move once or more and irradiating a plurality of small areas contained within a specific range of the mask in time sequence with a charged particle beam during each such continuous movement, the pattern in each small area is selectively projected onto a projection target area contained within a specific range of the wafer. The pattern to be projected onto one projection target area is divided and formed on a plurality of specific small areas contained within a specific range of the mask, and when the reduction ratio of the pattern projected from the mask onto the wafer is at 1/M, the continuous movement speed of the mask is set to be (N×M) times the continuous movement speed of the wafer (N being a real number larger than 1) and the charged particle beam to be conducted to the wafer is deflected in the direction of the continuous movement at a speed so that a relative speed of the pattern image which is projected onto the wafer and the wafer itself becomes substantially zero.

6 Claims, 19 Drawing Sheets

FIG. 1A
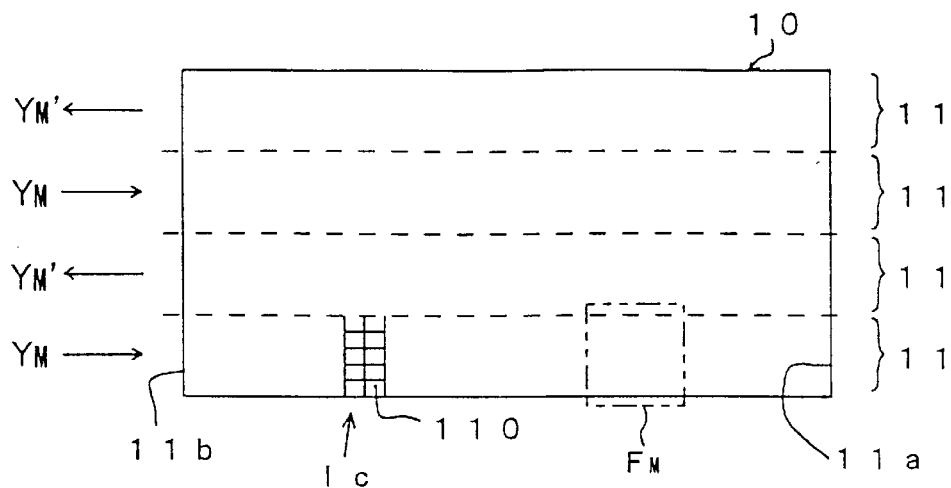
FIG. 1B
FIG. 1C
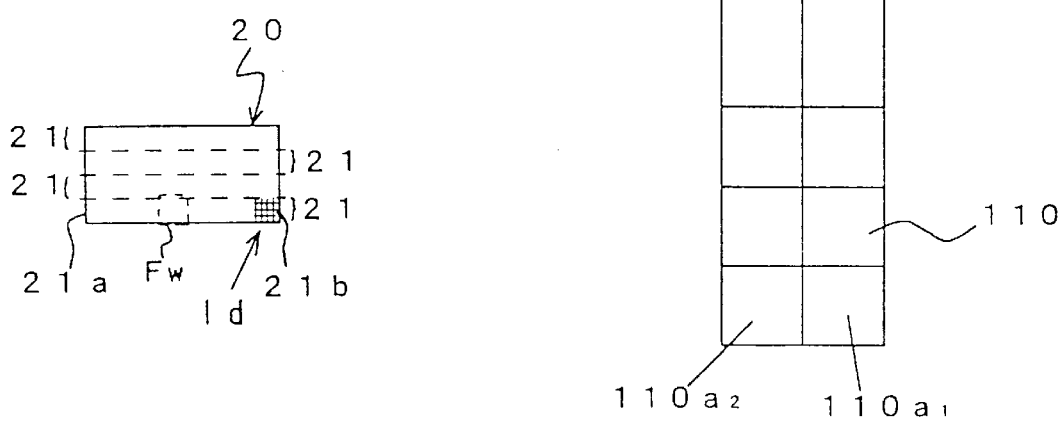
FIG. 1D
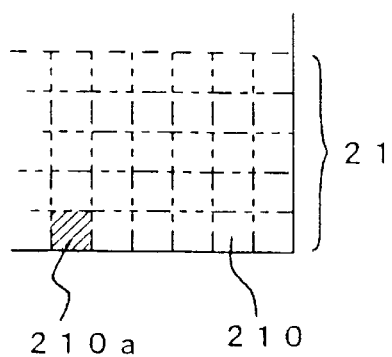

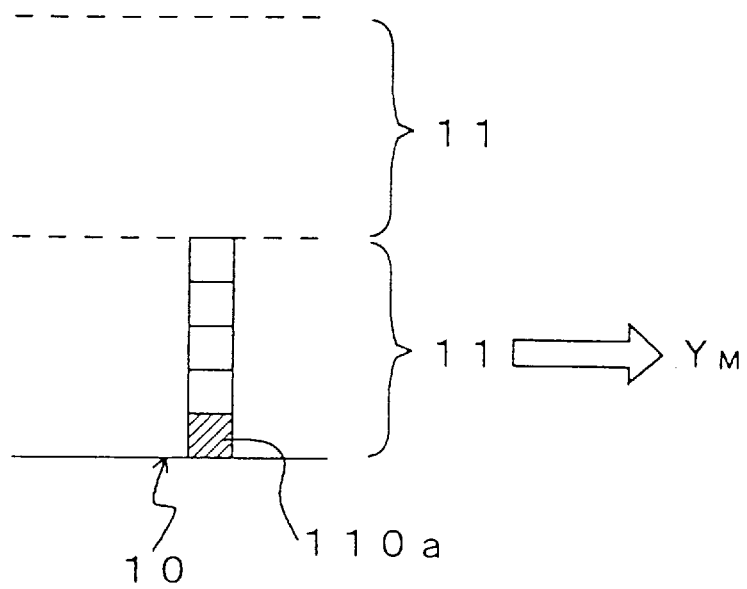

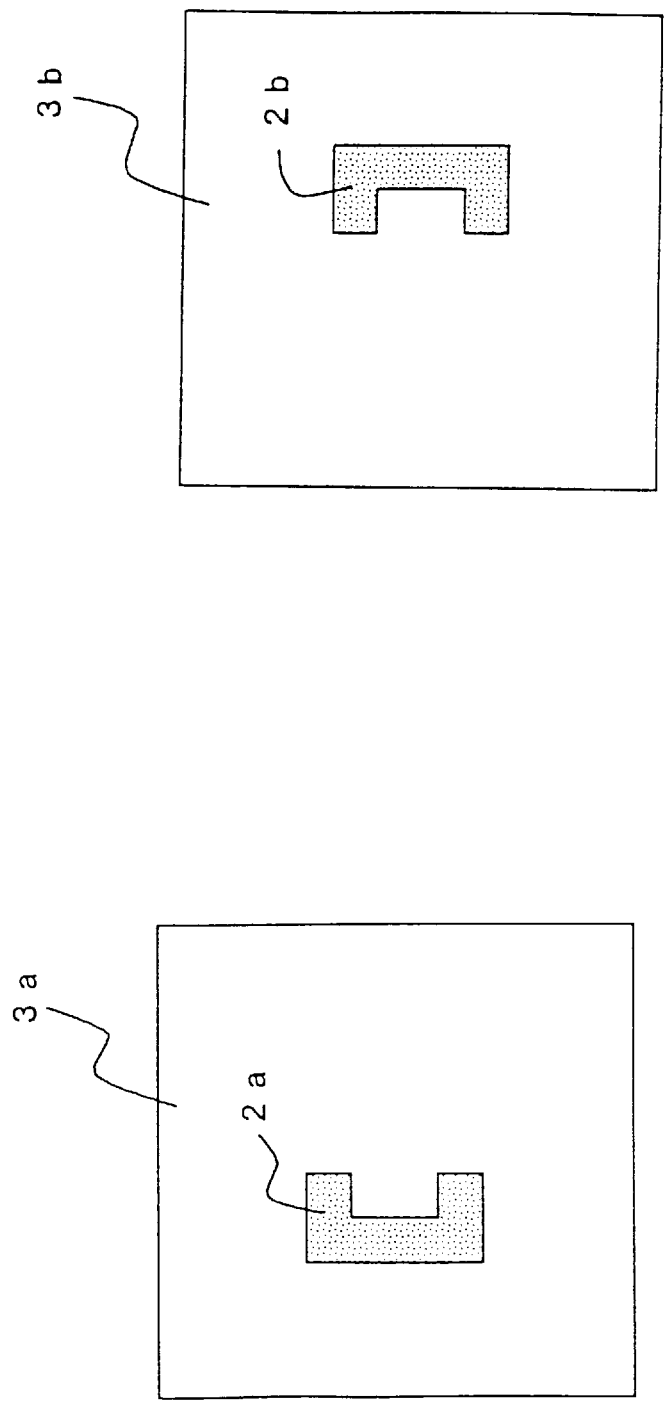

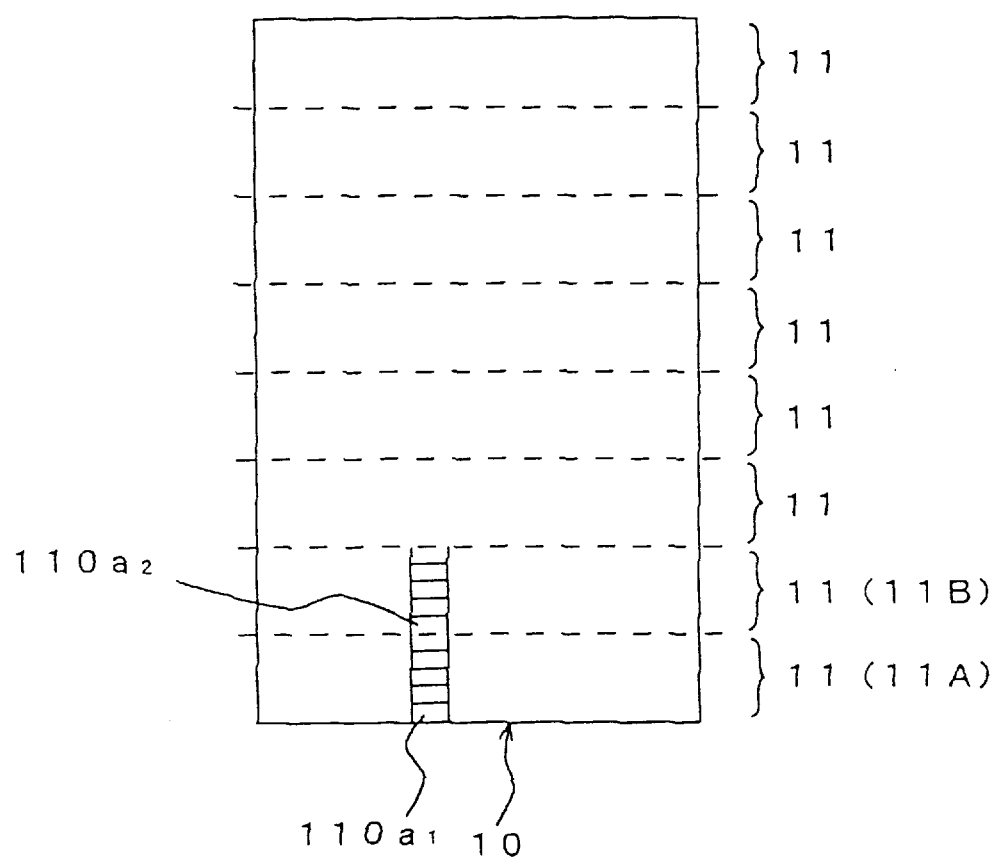

PATTERN PROJECTION METHOD WITH CHARGED PARTICLE BEAM UTILIZING CONTINUOUS MOVEMENT OF MASK AND SUBSTRATE

This is a division of application Ser. No. 08/696,050, filed Aug. 13, 1996.

BACKGROUND OF THE INVENTION

1. Field of the Invention

The present invention relates to a pattern projection method and a projection system employed for lithography and the like in the production of semiconductor integrated circuits and, more specifically, it relates to a method and a system whereby a mask pattern is projected onto a radiation sensitive substrate by using a charged particle beam such as an electron beam, an ion beam or the like.

2. Description of the Related Art

More and more research into electron beam exposure systems, which achieve both higher resolution and higher throughput in lithography, has been conducted in recent years. As an exposure method employed in this type of system, the method whereby projection is performed for one die (corresponding to one of the many integrated circuits formed on one wafer) or for a plurality of dies, has been examined in the prior art.

However, this method causes a number of problems that must be solved, such as the difficulty in producing a mask to be used as an original template for projection and the difficulty in keeping any aberration in the optical system within allowable limits in a large optical field of one die or more. As a solution, the partial projection method, whereby one or a plurality of dies are projected after being partitioned into smaller areas has been examined recently. In this case, pattern projection is performed by deflecting an electron beam by which specific locations on a mask and a radiation sensitive substrate such as wafer or the like are irradiated while continuously moving the mask and the radiation sensitive substrate. It is to be noted that the deflection of the electron beam is performed based upon the mask position and the radiation sensitive substrate position, which are detected by a detector such as a laser interferometer or the like.

With this method, since the irradiation range per shot of the electron beam is small, it is possible to perform pattern projection at a high resolution and with a high degree of accuracy by reducing the aberration in the optical system.

In the partial projection method described above, a mask provided with punched holes in correspondence to the pattern form, i.e., a so-called stencil mask, has been mainly used. However, as shown in FIG. 12, an island pattern, in which a beam limiting area 1 (the area where the charged particle beam is scattered or absorbed) is surrounded by a punched hole 2 for beam transmission, cannot be provided. In order to project such an island pattern, first, the punched hole 2 in FIG. 12 must be divided into two punched holes 2a and 2b, as shown in FIGS. 13A and 13B, and they must be separately formed on separate masks 3a and 3b respectively. Then, when projecting the patterns 2a and 2b of these masks 3a and 3b onto a radiation sensitive substrate such as a wafer, the projection patterns must be patched together on the radiation sensitive substrate to project the punched hole 2. In this case, the throughput is reduced due to switching of the mask 3a and 3b and the resulting activation and stoppage of the projection system.

In addition, in the projection method described above, a problem arises in that blurring occurs in the projection pattern in the following cases.

In the first such case, the ratio of the projection pattern projected onto a wafer and the pattern on a mask, that is the reduction ratio, and the ratio of the moving speed of the wafer stage and the mask stage, i.e., the drive devices for continuously moving the wafer and the mask respectively, do not match each other.

In the second such case, when irradiating a mask with a charged particle beam, the actual irradiation position deviates from the preset position resulting in the image of the pattern projected onto the wafer deviating from a specific position.

In the third such case, due to a delay generated between the time when the positions of the mask and the wafer are detected and the time when the electron beam is deflected, the image of the pattern projected onto the wafer becomes deviated from a specific position.

SUMMARY OF THE INVENTION

An object of the present invention is to provide a projection method and a charged particle beam projection system that achieve an improvement in throughput when projecting a projection pattern to be projected onto a radiation sensitive substrate using a charged particle beam by two or more separate projections.

Another object of the present invention is to provide a projection method and a charged particle beam projection system that are capable of eliminating the blurring and the position deviating in a projection pattern that occur when the reduction ratio of the pattern projection and the ratio of the moving speeds of the stages do not match, when the irradiation position of an electron beam becomes deviated or when a delay is generated at deflection of an electron beam.

In order to attain these objects:

(1) The present invention is applied to a pattern projection method in which a mask and a radiation sensitive substrate are each caused to make one or more continuous movements to perform projection and, while the one continuous movement of the mask and the radiation sensitive substrate is being performed, a plurality of small areas contained within a specific range of the mask are irradiated in time sequence by a charged particle beam to selectively project a pattern in each of the small areas onto one of a plurality of projection areas contained within a specific range of the radiation sensitive substrate. During projection exposure, the charged particle beam to be conducted from the mask to the radiation sensitive substrate is deflected in a direction of the continuous movement at a specific speed so that a relative speed of an image of the pattern which is projected onto the radiation sensitive substrate and the radiation sensitive substrate becomes substantially zero.

(2) In addition, the present invention is applied to a pattern projection method in which a mask and a radiation sensitive substrate are each caused to make one or more continuous movements to perform projection and, while the one continuous movement of the mask and the radiation sensitive substrate is being performed, a plurality of small areas contained within a specific range of the mask are irradiated in time sequence by a charged particle beam to selectively project a pattern in each of the small areas onto one of a plurality of projection areas contained within a specific range of the radiation sensitive substrate. A pattern to be projected onto a projection target area of the radiation sensitive substrate is divided and formed on a plurality of specific small areas contained within a specific range of the mask.

(3) Furthermore, the present invention is applied to a pattern projection method in which a mask and a radiation sensitive substrate are each caused to make one or more continuous movements to perform projection and, while the one continuous movement of the mask and one continuous movement of the radiation sensitive substrate are being performed, a plurality of small areas contained within a specific range of the mask are irradiated in time sequence by a charged particle beam to selectively project a pattern in each of the small areas onto one of a plurality of projection areas contained within a specific range of the radiation sensitive substrate. (a) A pattern to be projected onto a projection target area of the radiation sensitive substrate is divided and formed on a plurality of specific small areas contained within the specific range of the mask, (b) when a ratio of reduction of the pattern to be projected from the mask onto the radiation sensitive substrate is 1/M, a speed of the continuous movement of the mask is set at (M×N) times a speed of the continuous movement of the radiation sensitive substrate, the N being a real number larger than 1, and (c) during projection exposure, the charged particle beam to be conducted from the mask to the radiation sensitive substrate is deflected in a direction of the continuous movement of the radiation sensitive substrate at a specific speed so that a relative speed of the image of the pattern which is projected onto the radiation sensitive substrate and the radiation sensitive substrate becomes substantially zero.

(4) Also, the present invention is applied to a pattern projection method in which a mask and a radiation sensitive substrate are each caused to make one or more continuous movements to perform projection and, while the one continuous movement of the mask and one continuous movement of the radiation sensitive substrate are being performed, a plurality of small areas contained within a specific range of the mask are irradiated in time sequence by a charged particle beam to selectively project a pattern in each of the small areas onto one of a plurality of projection areas contained within a specific range of the radiation sensitive substrate. (a) A required time for pattern projection for the specific range of the mask from beginning to end is determined based upon an optimal value for irradiation time of the charged particle beam for each of the plurality of small areas of the mask and a required time for projection preparation for each of the small areas, (b) speeds of the continuous movements of the mask and the radiation sensitive substrate are set to ensure that the mask moves from a state in which one end of the specific range of the mask is present within a mask side optical field of a projection system to a state in which another end of the specific range of the mask is present within the mask side optical field, and the radiation sensitive substrate moves from a state in which one end of the specific range of the radiation sensitive substrate is present in a radiation sensitive substrate side optical field of the projection system to a state in which another end of the specific range of the radiation sensitive substrate is present within the radiation sensitive substrate side optical field, within the required time that has been determined, and (c) during projection exposure, the charged particle beam to be conducted from the mask to the radiation sensitive substrate is deflected in the direction of the continuous movements at a specific speed so that a relative speed of an image of the pattern which is projected onto the radiation sensitive substrate and the radiation sensitive substrate becomes substantially zero.

(5) Moreover, the present invention is applied to a charged particle beam projection system provided with: drive devices that cause a mask and a radiation sensitive substrate to move continuously in a specific direction; and a projector device that irradiates a plurality of small areas contained within a specific range of the mask in time sequence with a charged particle beam to selectively project a pattern in each of the small areas onto one of a plurality of projection areas contained within a specific range of the radiation sensitive substrate during one set of continuous movements by the drive devices. The charged particle beam projection system comprises: (a) a projection time determining device that determines a required time for pattern projection for the specific range of the mask from beginning to end, based upon an optimal value for a duration of irradiation of the charged particle beam for each of the plurality of small areas of the mask and a required time for projection preparation for each of the small areas; (b) a continuous movement speed setting device that sets speeds of continuous movements of the mask and the radiation sensitive substrate to ensure that the mask moves from a state in which one end of the specific range of the mask is present within a mask side optical field of a projection system to a state in which another end of the specific range of the mask is present within the mask side optical field, and the radiation sensitive substrate moves from a state in which one end of the specific range of the radiation sensitive substrate is present within a radiation sensitive substrate side optical field of the projection system to a state in which another end of the specific range of the radiation sensitive substrate is present within the radiation sensitive substrate side optical field, within the required time determined by the projection time determining device; and (c) a speed difference eliminating device that deflects the charged particle beam to be conducted from the mask to the radiation sensitive substrate in the direction of the continuous movements at a specific speed so that a relative speed of an image of the pattern which is projected onto the radiation sensitive substrate and the radiation sensitive substrate becomes substantially zero during projection exposure.

(6) Also, the present invention is applied to a pattern projection method in which a radiation sensitive substrate is caused to make one or more continuous movements to perform projection and during the one continuous movement of the radiation sensitive substrate a plurality of small areas contained within a specific range of a mask are irradiated by a charged particle beam to selectively project a pattern in each of the small areas onto one of a plurality of projection areas contained within a specific range of the radiation sensitive substrate. (a) A required time for pattern projection for the specific range of the radiation sensitive substrate from beginning to end is determined based upon an optimal value for a duration of irradiation of the charged particle beam for each of the projection target areas of the radiation sensitive substrate and a time required for projection preparation for each of the projection target areas, (b) a speed of the continuous movement of the radiation sensitive substrate in which one end of the specific range of the radiation sensitive substrate is present within an optical field of a projection system at the radiation sensitive substrate side to a state in which another end of the specific range of the radiation sensitive substrate is present within the optical field at the radiation sensitive substrate side within the required time that has been determined, and (c) during projection exposure, the charged particle beam to be conducted from the mask to the radiation sensitive substrate is deflected in a direction of the continuous movement at a specific speed so that a relative speed of an image of the pattern which is projected onto the radiation sensitive substrate and the radiation sensitive substrate becomes substantially zero.

(7) In addition, according to the present invention, since a pattern in one small area of the mask is projected onto a plurality of specific projection target areas contained within the specific range of the radiation sensitive substrate, the mask size can be reduced.

(8) Furthermore, the present invention is applied to a charged particle beam projection system provided with a drive device that causes a radiation sensitive substrate to move continuously in a specific direction, and a projector device that irradiates a plurality of small areas contained within a specific range of the mask in time sequence with a charged particle beam to selectively project a pattern in each of the small areas onto one of a plurality of projection areas contained within a specific range of the radiation sensitive substrate during one continuous movement by the drive device. The charged particle beam projection system comprises: (a) a projection time determining device that determines a required time for pattern projection for the specific range of the radiation sensitive substrate from beginning to end based upon an optimal value for a duration of irradiation of the charged particle beam for each of the plurality of target areas of the radiation sensitive substrate and a time required for projection preparation for each of the target areas; (b) a continuous movement speed setting device that sets a speed of continuous movement of the radiation sensitive substrate driven by the drive device to ensure that the radiation sensitive substrate moves from a state in which one end of the specific range of the radiation sensitive substrate is present in an optical field of the projection system at the radiation sensitive substrate side to a state in which another end of the specific range of the radiation sensitive substrate is present within the optical field at the radiation sensitive substrate side within the required time determined by the projection time determining device; and (c) a speed difference eliminating device that deflects the charged particle beam to be conducted from the mask to the radiation sensitive substrate in the direction of the continuous movement at a specific speed so that a relative speed of an image of the pattern which is projected onto the radiation sensitive substrate and the radiation sensitive substrate becomes substantially zero during projection exposure.

(9) Furthermore, the present invention is applied to a charged particle beam projection system that detects positions of a mask and a radiation sensitive substrate which make continuous movements and, based upon values thereby detected, project a pattern of the mask onto the radiation sensitive substrate by deflecting a charged particle beam. The charged particle beam projection system comprises: a correction device that corrects a positional deviation of a projected pattern caused by a first delay from a time when the position of the mask is detected until the charged particle beam by which the mask is irradiated is deflected and a second delay from a time when the position of the radiation sensitive substrate is detected until the charged particle beam by which the radiation sensitive substrate is irradiated is deflected.

(10) In a charged particle beam projection system according to the present invention, the correction device corrects a positional deviation of a projected pattern caused by a positional deviation between a irradiation position on the mask which should be irradiated by the charged particle beam and a irradiation position at which irradiation is actually performed with the charged particle beam, in addition to performing positional deviation correction for a projected pattern caused by the first delay and the second delay.

BRIEF DESCRIPTION OF THE DRAWINGS

FIGS. 1A–1D show an example of a mask and a radiation sensitive substrate used in a first embodiment of the pattern projection method according to the present invention, with FIG. 1A being a plan view of the mask and FIG. 1B being a plan view of the radiation sensitive substrate, FIG. 1C being an enlargement of the Ic portion in FIG. 1A and FIG. 1D being an enlargement of the Id portion of FIG. 1B.

FIGS. 5A and 5B show another variation of the mask and radiation sensitive substrate;

FIGS. 13A and 13B show an example in which the island pattern shown in FIG. 12 is divided into two portions to be provided on masks; and FIGS. 14A–14C show reference examples for comparison against the pattern projection method according to the present invention.

DESCRIPTION OF THE PREFERRED EMBODIMENTS

First Embodiment

Figure 2A:
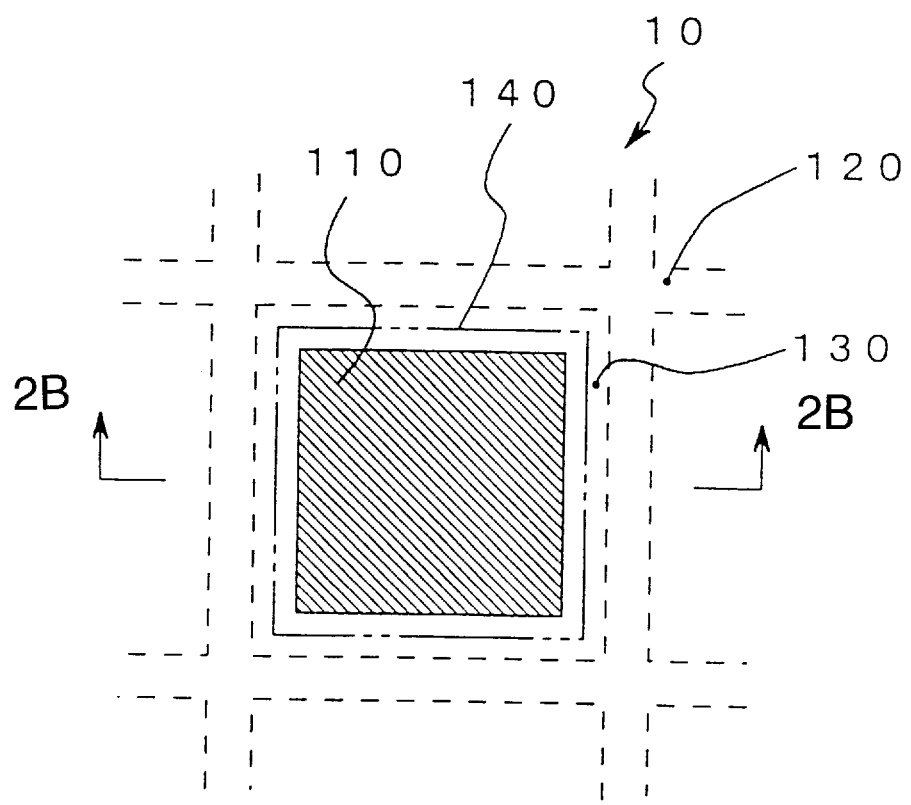
FIGS. 2A and 2B show an example of the mask with FIG. 2A being a plan view of a small area and FIG. 2B being a cross section taken along line A—A in FIG. 2A.
Figure 2:
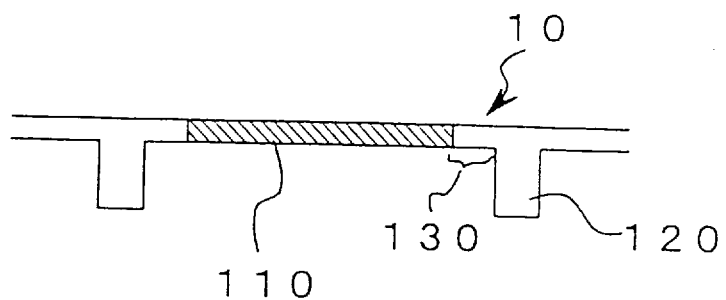

FIGS. 1A–1D illustrate the pattern projection method according to the present invention, and show small areas 110 of a mask 10 and projection target areas 210 of a radiation sensitive substrate 20. FIG. 1A is a plan view of the mask 10, FIG. 1B is a plan view of the radiation sensitive substrate 20, FIG. 1C is an enlargement of the Ic portion in FIG. 1A and FIG. 1D is an enlargement of the Id portion in FIG. 1B. The mask 10 and the radiation sensitive substrate 20 are respectively provided with four rows each of specific ranges 11 and 21. The small areas 110 on the mask 10 constitute an area of one shot of irradiation with, for instance, a charged particle beam and while the mask 10 is caused to move continuously once in either the left or right direction in FIG. 1A, the pattern within each of a specific ranges 11 is projected onto a corresponding specific range 21 of the radiation sensitive substrate 20.

FM and FW respectively indicate the optical fields on the mask 10 and the radiation sensitive substrate 20, and these are the ranges over which pattern projection can be performed at a specific degree of accuracy with finite broadening around the optical axis AX of the charged particle beam optical system. The areas outside of the optical fields FM and FW are not used for projection. It is to be noted that the number of rows can be changed as necessary. When a plurality of rows are present, stepping drive is performed for the mask 10 and the radiation sensitive substrate 20 in the direction running at a right angle to the direction of the continuous movement every time the projection of one row is completed and the rows in a specific ranges 11 and 21 that are adjacent to the previous rows are positioned to the optical fields FM and FW in the projection system. As indicated with the arrows YM and YM' in FIG. 1A, the direction of the continuous movement is switched for each row. In FIG. 1A and FIG. 1B the areas of the optical fields FM and FW are indicated as square shapes. However the area using for exposure is not limited to the square shape. For example, the area can be a rectangular shape. And if the direction running at a right angle to the moving direction of a stage is assigned as a long side of the rectangular shape, the length of this long side can be made longer than the length of the square shape. And this can cause to reduce the number of rows of the specific ranges 11. Accordingly, the throughput can be improved.

Figure 12:
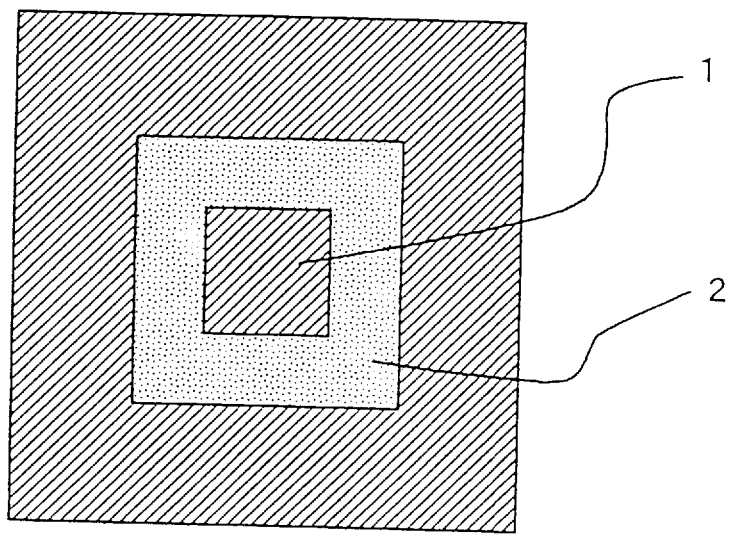
FIG. 12 shows an island pattern.

A pattern to be projected onto one of the projection target areas, i.e., the projection target area 210a of the radiation sensitive substrate 20 shown in FIG. 1D is partitioned into a plurality of patterns and the plurality of patterns are formed on a plurality of small areas included in one specific range 11 of the mask 10, respectively, i.e., on small areas 110a1 and 110a2 in FIG. 1C, for instance. A specific range 11 here represents a range over which a pattern can be projected while the mask 10 continuously moves once. Such partitioning becomes necessary when projecting an island pattern such as the one shown in FIG. 12, for instance, but partitioning can be implemented as necessary in other circumstances as well. For instance, when the pattern (beam transmission area) density is high in a small area 110, there is a likelihood that blurring will occur in the pattern image due to the Coulomb effect. The pattern in a small area 110 may be formed at the mask 10 by dividing it into a plurality of patterns in such a case. When a pattern is partitioned in this manner, the patterns in the small areas 110a1 and 110a2 are projected in the same projection target area 210a.

On the supposition that the number of projection target areas 210 in one specific range 21 of the radiation sensitive substrate 20 is P and that the pattern in each projection target area 210 is partitioned into two and is formed on two small areas 110 of the mask 10, the number of small areas 110 contained in one specific range 11 is 2P. With the time required for projecting the pattern in one small area 110 set at ts, the minimum length of time required for pattern projection of one specific range 21 of the radiation sensitive substrate 20 is 2Pts.

Figure 14B:
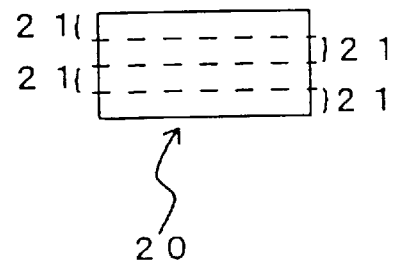
Figure 14C:
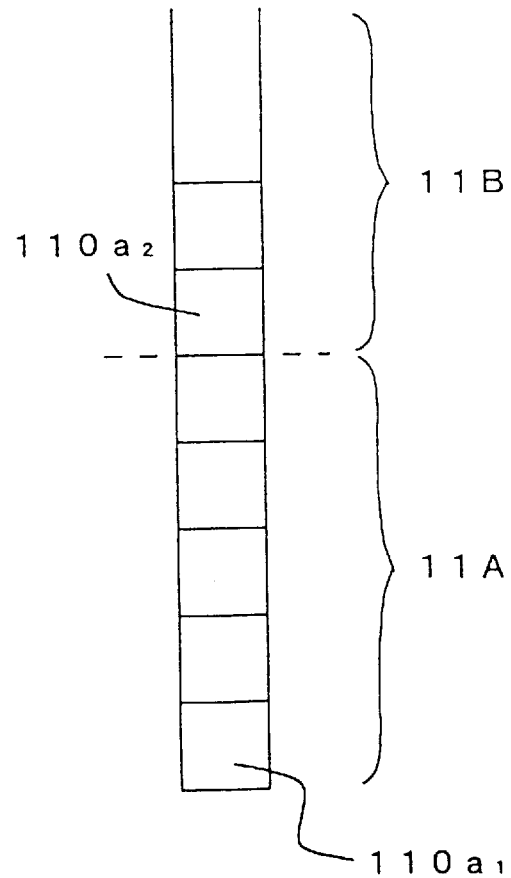

Now, let us consider a case in which, as shown in FIGS. 14A–14C, one of the two small areas 110a1 and 110a2 corresponding to one projection target area 210 is formed in one specific range 11A of the mask 10 and the other small area is formed in another specific range 11B of the mask 10, for comparison. In this case, too, if each specific range 21 of the radiation sensitive substrate 20 is provided with P projection target areas 210 and the pattern in each projection target area 210 is partitioned and then formed over two small areas 110 of the mask 10, the minimum length of time required for projecting the pattern over the entirety of one specific range 21 is 2Pts, as in the case described above.

However, although, in the case presented in FIGS. 1A–1D, the small areas 110a1 and 110a2 corresponding to one projection target area 210a are included in the same specific range 11, in the case presented in FIGS. 14A–14C, the small area 110a1 and the small area 110a2 are included in a specific ranges 11A and 11B respectively. Because of this, when projecting the pattern in the small areas 110a1 and 110a2 of the mask 10 onto the projection target area 210a, the pattern in the small area 110a1 included in a specific range 11A must be first projected and then the patterns in the small area 110a2 included in a specific range 11B must be projected by reversing the direction of the continuous movements of the mask 10 and the radiation sensitive substrate 20.

As a result, in the case presented in FIGS. 14A–14C, the number of rows of specific ranges is double that in the case presented in FIGS. 1A–1D, requiring twice as many scanning sessions. In addition, dead time, during which no projection is performed, occurs due to the starting and stopping of the device for causing the mask 10 to move, the switching of the moving direction and the acceleration time before the speed of the continuous movement reaches a specific value. This dead time is almost halved in the case presented in FIGS. 1A–1D compared to the case presented in FIGS. 14A–14C.

Thus, since, when projecting a pattern divided and then provided over a plurality of small areas of the mask 10 onto one projection target area on the radiation sensitive substrate, these plurality of small areas are included in a specific range which constitutes a range over which projection is possible in one continuous movement, the dead time resulting from looping back the mask and the like is minimized, making it possible to achieve a high throughput.

FIGS. 2A and 2B show an example of the mask 10, with FIG. 2A being a plan view showing a small area 110 and FIG. 2B being a cross section taken along line A—A in FIG. 2A. In FIGS. 2A and 2B, reference number 120 indicates struts for mechanically fortifying the mask 10 and a skirt 130 which constitutes a charged particle beam screening area provided between the struts 120 and the small areas 110. Reference number 140 indicates a range of irradiation of the charged particle beam. Since the strut 120, the skirt 130 and the like are provided in addition to the small area 110, the length of a specific range 11 of the mask 10 in regard to the direction of the continuous movement, is larger than the inverse multiple of the reduction ratio 1/M of the pattern image relative to the length of a specific range 21 of the radiation sensitive substrate 20.

Figure 3A:
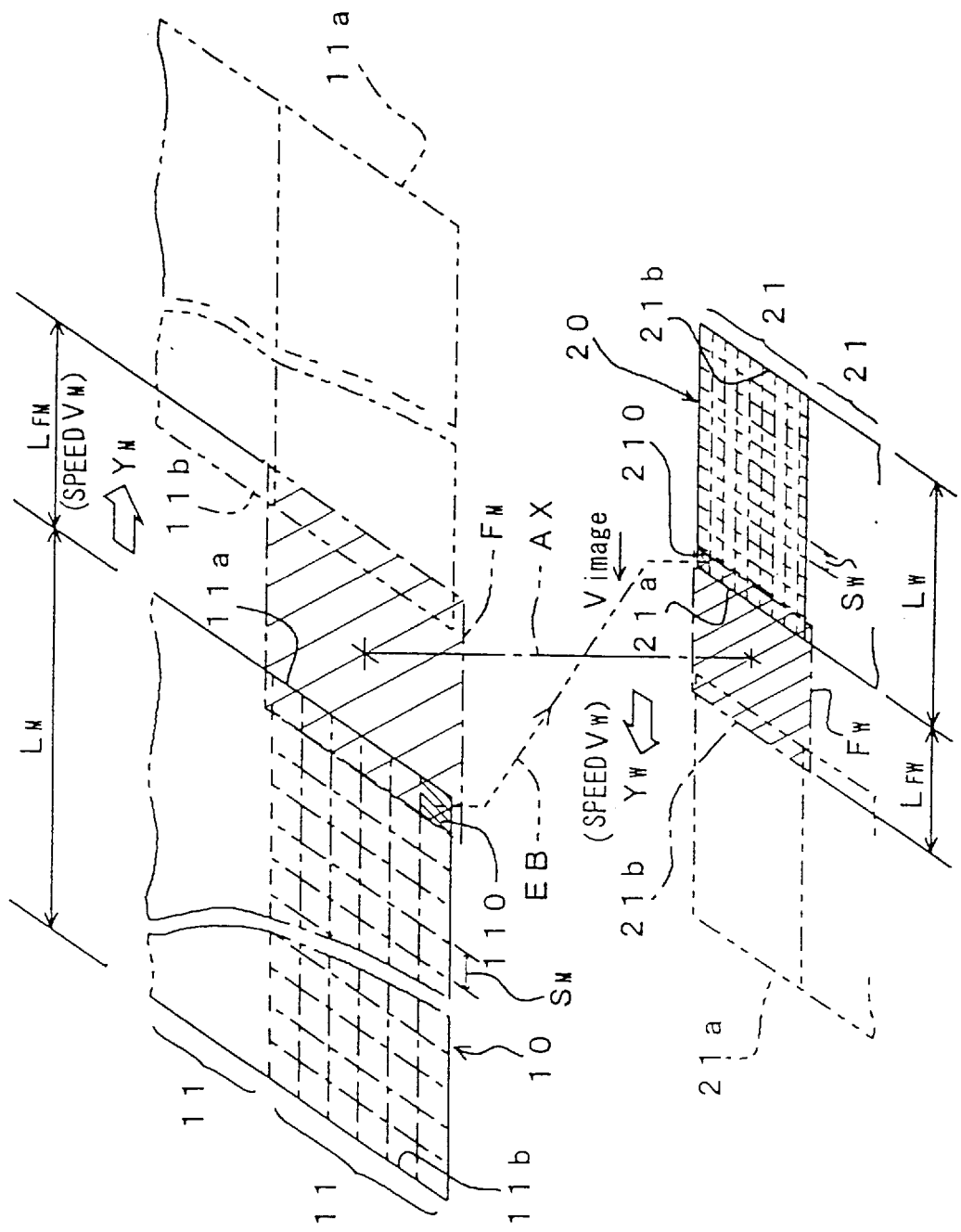
FIGS. 3A and 3B illustrate the continuous movements of the mask and the radiation sensitive substrate in the first embodiment, with FIG. 3A showing a case in which the distances traveled by the mask and the radiation sensitive substrate are set at the maximum and FIG. 3B showing a case in which the distances traveled by the mask and the radiation sensitive substrate are set at the minimum.
Figure 3B:
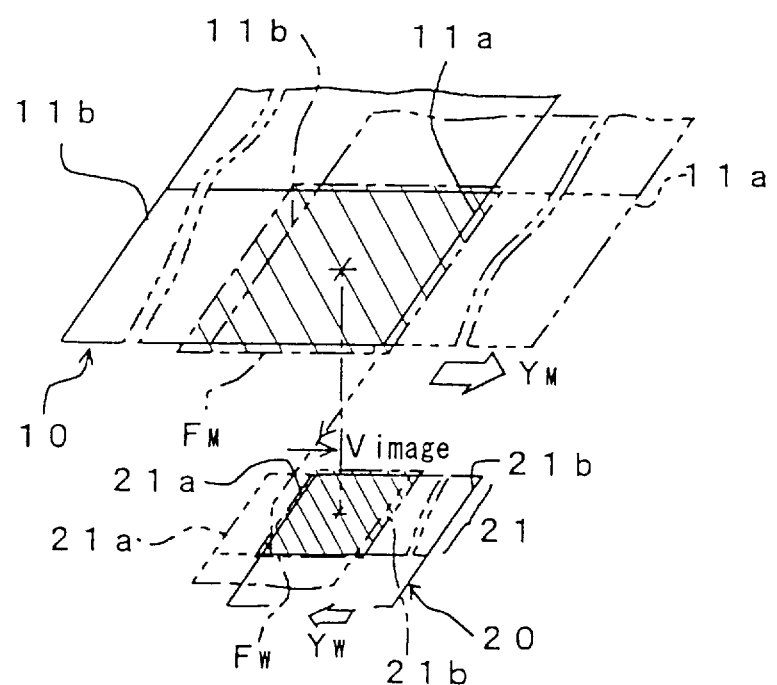

As indicated with the solid lines in FIGS. 3A and 3B, all the small areas 110 within a specific range 11 can be irradiated by a charged particle beam with a high degree of efficiency by ensuring that the radiation sensitive substrate travels in the direction indicated with the arrow YW from a state in which one end 21a of the radiation sensitive substrate 20 has entered the optical field FW of the projection system at the radiation sensitive substrate side to a state in which another end 21b has entered the optical field FW at the radiation sensitive substrate side while the mask 10 travels continuously in the direction indicated with the arrow YM from a state in which one end 11a of the mask 10 has entered an optical field FM of the projection system at the mask side to a state in which the other end 11b of the mask 10 has entered the optical field FM at the mask. Consequently, it is essential that the continuous movement speed VM of the mask 10 during projection be set at N·M times (N being a real number larger than 1) the continuous movement speed VW of the radiation sensitive substrate 20.

Since the moving speed Vimage of the pattern image to be projected onto the radiation sensitive substrate 20 is 1/M times the moving speed Vm of the mask 10 with the reduction ratio being 1/M, i.e., Vimage=VM/M, it does not match the moving speed VW=VM/(N·M) of the radiation sensitive substrate 20 explained above. If this is left as is, blurring occurs in the pattern image to be projected onto the radiation sensitive substrate 20 due to the difference in their speeds.

In order to avoid this, during the continuous movement, the charged particle beam to be conducted from the mask 10 to the radiation sensitive substrate 20 is deflected in the direction of the continuous movement at a specific speed so that the speed of the pattern image relative to the radiation sensitive substrate 20 is 0. It is desirable to perform this deflection operation using an electrostatic deflector with outstanding response.

Either of the following two methods may be employed for determining the deflection speed during the continuous movement in this process.

In the first method, the continuous moving speed VM of the mask 10 and the continuous moving speed VW of the radiation sensitive substrate 20 are detected during the projection and the deflection speed VWD is determined based upon the detected values and the reduction ratio of the image 1/M, using the following expression (1).

$$VWD = VW - (VM/M) \quad (1)$$

For the speed VM, the direction in which the image projected on the radiation sensitive substrate 20 advances in the direction of the continuous movement of the radiation sensitive substrate 20 is set as a positive direction and for the speeds VW and VWD, the direction of the continuous movement of the radiation sensitive substrate 20 is set as a positive direction. It is to be noted that when an error in the direction of the continuous movement, i.e., the angle θ formed by the vectors of the speeds VM and VW can also be detected, the following expression (2) is used.

$$VWD = VW - (VM/M) \cos\theta \quad (2)$$

It is to be noted that the speed may be calculated based upon the values obtained by detecting the displacement and acceleration of the mask 10 and of the radiation sensitive substrate 20 as physical quantities related to the speeds instead of directly detecting the speeds VM and VW.

In the second method, the continuous movement speeds of the mask 10 and the radiation sensitive substrate 20 are calculated based upon the sensitivity of the resist applied on the radiation sensitive substrate 20, the beam current density of the charged particle beam, the blank space in the mask 10 (the boundary areas between small areas and the like), the number of times projection is performed and the like, and the deflection speed is determined based upon the calculated value and the reduction ratio of the image. The details are given below.

When the irradiation time required for irradiating the entirety of one specific range 11 of the mask 10 with a charged particle beam (including the irradiation stop time for switching small areas to be irradiated) is designated TM and the pattern projection time required for projecting a pattern onto the entirety of one specific range 21 of the radiation sensitive substrate 20 is designated TW, they are equal to each other, i.e., TM=TW=T. It must be ensured that the projection of the pattern for a specific ranges 11 and 21 be completed within this time period T. Namely, the continuous movement speed VM of the mask 10 is set so that the mask 10 moves from a state in which one end 11a of the one specific range 11 is present in the optical field FM at the mask side to a state in which the other end 11b of a specific range 11 is present in the optical field FM at the mask side within the time T explained above.

At this point, the mask 10 moves as shown in FIGS. 3A and 3B. FIG. 3A illustrates a case in which the distances traveled by the mask 10 and the radiation sensitive substrate 20 are at their maximum, whereas FIG. 3B illustrates a case in which the distances traveled by the mask 10 and the radiation sensitive substrate 20 are at their minimum, and the traveling distances may be set within these ranges. As these figures clearly demonstrate, when the entire length of a specific range 11 of the mask 10 is designated LM, the width of the optical field FM at the mask side in the direction of the continuous movement is designated LFM and the width of the small area at the mask side in the direction of the continuous movement is designated SM, and with the maximum and minimum values for the traveling distances mentioned above taken into consideration, the mask 10 only needs to travel over a distance La expressed in the following expression (3) within the time T explained above.

$$La = LM + LFM - 2SM$$

$$\text{through } La = LM - LFM \quad (3)$$

The same concept applies to the radiation sensitive substrate 20; when the entire length of a specific range 21 is designated LW, the width of the optical field FW at the radiation sensitive substrate side in the direction of the continuous movement is designated LFW and the width of the projection target area 210 at the radiation sensitive substrate side in the direction of the continuous movement is designated SW, the radiation sensitive substrate 20 only needs to travel over a distance Lb expressed in the following expression (4) within the specific time period T explained earlier.

$$Lb = LW + LFW - 2SW$$

$$\text{through } Lb = LW - LFW \quad (4)$$

Thus, the speeds VM and VW of the continuous movement are:

$$VM = La/T$$

$$VW = Lb/T \quad (5)$$

Since, in these expressions, T is the length of time required for pattern projection onto a specific range 11, $$T = \Sigma ts + \Sigma tbs \quad (6)$$

It is to be noted that ts is the optimum value for the duration of irradiation of the charged particle beam for one small area 110, and when the sensitivity of the resist applied to the radiation sensitive substrate 20 is designated S ($\mu$C/cm$^2$) and the beam current density of the charged particle beam is designated A ($\mu$/cm$^2$), it can be expressed in the following expression (7).

$$ts = S/A \quad (7)$$

tbs represents the preparation time elapsing after irradiation of the charged particle beam for one small area 110 ends until irradiation of the charged particle beam for the next small area 110 begins. It is to be noted that the period of irradiation time of the charged particle beam may vary for each small area 110 due to correction for the proximity effect and the like. In addition, depending upon the distance that the beam travels when switching the object of the irradiation of the charged particle beam from one small area 110 to the next small area 110, the preparation time tbs may also vary. Furthermore, if multi-shot irradiation is performed, the number of times the preparation time tbs is added increases.

In any case, the values of ts and tbs can be determined based upon design data and the like of the pattern of the mask 10. With the continuous movement speeds VM and VW determined in the manner described above, the deflection speed VWD can be calculated using those values and the reduction ratio 1/M with the expression (1) given earlier.

However, since deviations may occur between the deflection speed and the continuous movement speeds that have been calculated and set, and the actual speed, it is desirable to determine the deflection speed by employing the first method, in which VM and VW are actually detected. It is to be noted that even when the first method is employed, the setting of the continuous movement speeds for the mask 10 and the radiation sensitive substrate 20 is performed using the second method.

Thus, in the projection method described above, since the charged particle beam is deflected during the continuous movement in such a manner that the speed of the pattern image to be projected onto the radiation sensitive substrate relative to the radiation sensitive substrate is 0, projection without blurring can be performed with a high degree of precision.

Figure 4A:
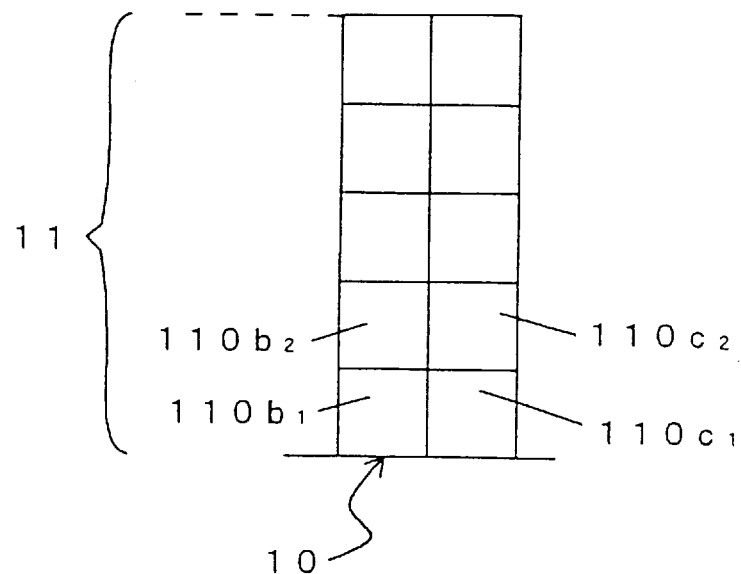
FIGS. 4A and 4B show variations of FIG. 1.
Figure 4B:
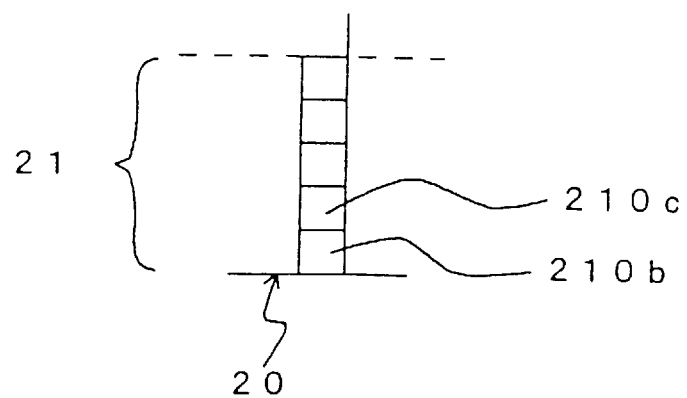

It is to be noted that in the FIGS. 1A–1D, the small areas 110$a$1 and 110$a$2 are provided adjacent to each other in the direction of the continuous movement, they may be arranged as shown in FIGS. 4A and 4B, for instance. FIGS. 4A and 4B respectively correspond to FIGS. 1C and 1D, and the pattern in one projection target area 210$b$ of the radiation sensitive substrate 20 is divided and then provided over a pair of small areas 110$b$1 and 110$b$2 adjacent to each other in the direction (the vertical direction in the figures) running at a right angle to the direction of the continuous movement on the mask 10. The pattern in a projection target area 210$c$, which is adjacent in the direction running at a right angle to the direction of the continuous movement, is divided and then provided over two small areas 110$c$1 and 110$c$2 adjacent to the small areas 110$b$1 and 110$b$2 in the direction of the continuous movement.

Figure 5B:
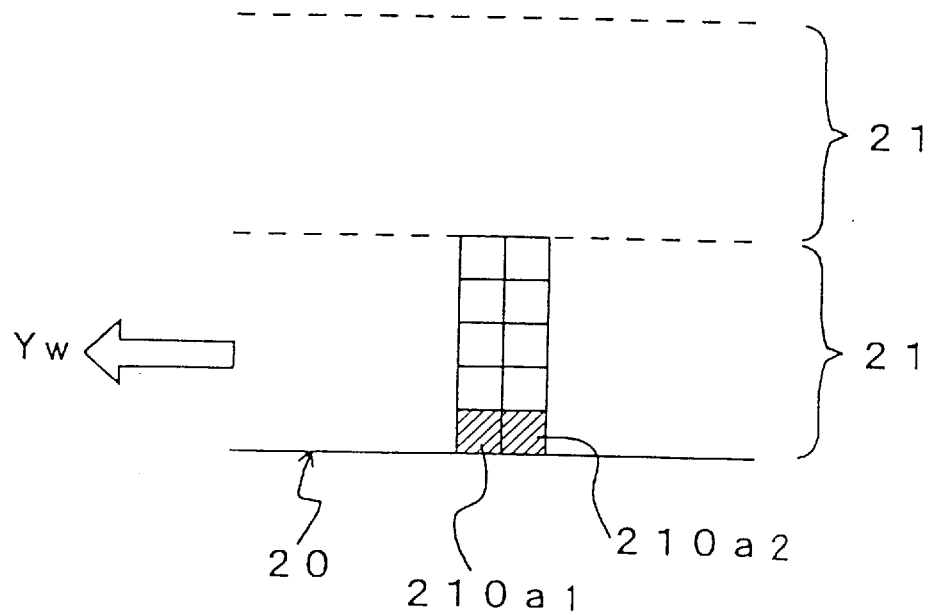

While the explanation has been given in reference to FIGS. 1A–1D and FIGS. 4A and 4B, for a case in which a pattern formed over two small areas contained within a specific range 11 of the mask 10 is projected onto one projection target area in a specific range 21 of the radiation sensitive substrate 20, the present invention may be adopted in a case in which a pattern in one small area contained within a specific range 11 of the mask 10 is projected onto a plurality of projection target areas contained within a specific range 21 of the radiation sensitive substrate 20, and such an example is shown in FIGS. 5A and 5B.

In FIGS. 5A and 5B, which correspond to FIGS. 1A and 1B respectively, a pattern formed in a small area 110$a$ of the mask 10 is projected onto projection target areas 210$a$1 and 210$a$2 of the radiation sensitive substrate 20. While the pattern is projected onto two projection target areas that are provided contiguously in the direction of the continuous movement of the substrate 20 (direction YW) in FIG. 5B, the present invention may be adopted in a similar manner in a case in which projection is performed onto projection target areas provided contiguously in a direction running at a right angle to the direction of the continuous movement. In either case, since the number of times the direction of the continuous movement of the mask 10 and the radiation sensitive substrate 20 are switched is the same as that is in the cases shown in FIGS. 1A–1D, FIGS. 3A and 3B, and FIGS. 4A and 4B, a high throughput is achieved.

When projection is performed in the manner illustrated in FIGS. 5A and 5B, since the pattern in the small area 110 is used in correspondence to a plurality of projection target areas 210, the size of the mask can be reduced and production is facilitated compared to a case in which the small area 110 is made to correspond to one specific projection target area 210. In addition, since the moving speed of the mask stage can also be reduced, the cost of system production can be reduced.

Furthermore, by performing projection in this manner, if the number of small areas 110 of the mask 10 is small enough for the mask 10 to be contained within the optical field FM at the mask side, projection can be performed without moving the mask 10. In this case, only the stage of the radiation sensitive substrate is caused to move continuously to perform projection, while the mask stage remains stationary. It is to be noted that when moving to a different specific range 11, the mask stage is caused to move in steps in a direction running at a right angle to the direction of the continuous movement.

Figure 6:
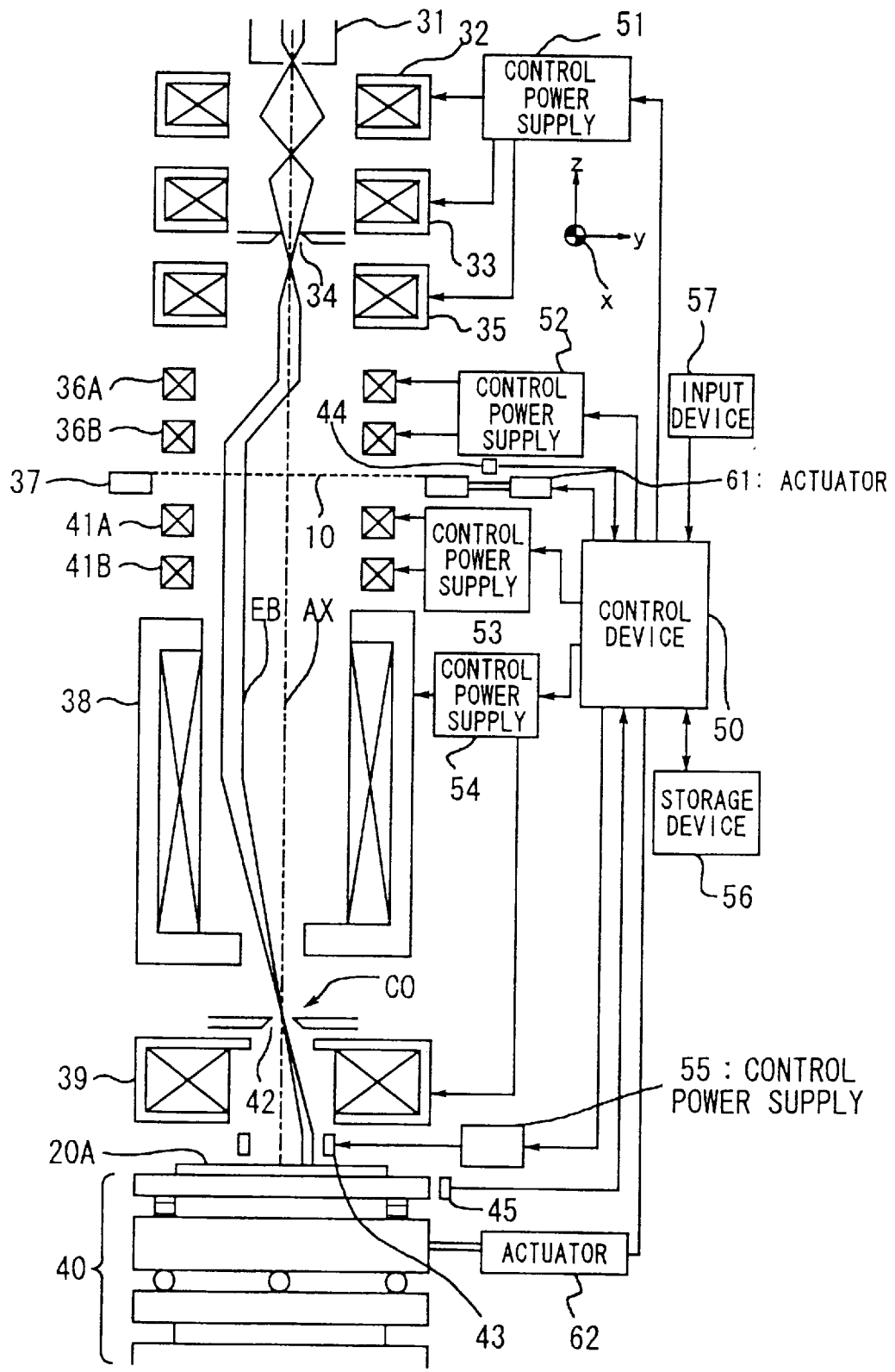
FIG. 6 schematically shows an embodiment of the projection system according to the present invention.

FIG. 6 shows a schematic structure of an embodiment of the electron beam reduction projection system according to the present invention. In the figure, the z axis is set in the direction running parallel to the optical axis AX of the optical system. The direction of the x axis matches the direction of the continuous movement of the mask 10 and a wafer 20A (which corresponds to the radiation sensitive substrate 20 in FIGS. 1A–1D and FIGS. 5A and 5B). In FIG. 6, reference number 31 indicates an electron gun and an electron beam EB discharged from this gun is focused by condenser lenses 32 and 33 and is shaped into a beam with a rectangular cross section by a first aperture 34. The shaped electron beam EB is adjusted to become parallel to the optical axis AX by a condenser lens 35, is deflected by a specific quantity at deflectors 36A and 36B provided over two stages and enters a specific area of the mask 10, which is mounted on a mask stage 37. The deflector 36A is constituted by combining two sets of deflecting coils that generate deflecting magnetic fields extending in a specific direction running at a right angle to the optical axis AX in such a manner that their deflecting directions are different from each other. By adjusting the value of the electrical current supplied to each set of the deflecting coils in the deflector 36A, the electron beam EB can be deflected in any direction within a plane running at a right angle to the z axis. This is also the case with the deflectors 36B. The mask stage 37 is driven in the direction of the x axis and the direction of the y axis by an actuator 61. As explained earlier in reference to FIGS. 1A–1D and FIGS. 3A and 3B, the mask 10 is provided with at least one row constituting a specific range 11 with a plurality of small areas 110 contained in it. A pattern to be projected onto one projection target area 210 of the wafer 20A is divided and then formed over at least some of the small areas 110.

The electron beam EB, having been transmitted through the mask 10 and enters the wafer 20A, which is mounted on a wafer stage 40, at a specific position after passing through projecting lenses 38 and 39 provided over two stages. The projecting lenses 38 and 39 constitute an optical reduction system and its reduction ratio may be set at 1/4, for instance. The wafer stage 40 is driven in the directions of the x axis and the y axis by an actuator 62. Deflectors 41A and 41B provided over two stages for adjusting the entry position of the electron beam into the wafer 20A are provided between the mask stage 37 and the wafer stage 40. The schematic structure of the deflectors 41A and 41B is identical to that of the deflectors 36A and 36B. A second aperture 42, which prevents the electron beam that has been scattered over a specific quantity by the mask 10 from entering the wafer 20A, is provided in the vicinity of the cross-over CO of the electron beam imparted by the projecting lenses 38 and 39.

In addition, an electrostatic deflector 43 is provided between the second aperture 42 and the wafer stage 40. The electrostatic deflector 43 is provided with a pair of electrodes which flank the optical axis AX in the direction of the x axis and deflect the electron beam EB in the direction of the x axis, i.e., in the direction of the continuous movement of the mask 10 and the wafer 20A, by generating a voltage difference between the pair of electrodes.

It is to be noted that for convenience, the electrodes are shown facing opposite each other in the direction of the y axis in the figure. Reference number 44 indicates a laser interferometer position sensor which detects the position of the mask stage 37 in the directions of the x axis and the y axis and reference number 45 indicates a laser interferometer position sensor that detects the position of the wafer stage 40 in the directions of the x axis and the y axis. The information detected by these position sensors 44 and 45 is input to a control device 50 which also functions as the projection time determining device and the continuous movement speed setting device.

A control power supply 51 for the condenser lenses 32, 33 and 35, a control power supply 52 for the deflectors 36A and 36B, a control power supply 53 for the deflectors 41A and 41B, a control power supply 54 for the projecting lenses 38 and 39, a control power supply 55 for the electrostatic deflector 43 and the actuators 61 and 62 are connected to the control device 50. The output currents from the individual control power supplies 51–54 and the output voltage from the control power supply 55 are controlled by the control device 50. By controlling the actuators 61 and 62, the control device 50 also controls the movements of the mask stage 37 and the wafer stage 40.

Reference number 56 indicates a storage device for the control device 50. During the preparatory stage prior to projection, projection data required for various types of control to be performed during projection are input from an input device 57 to the control device 55 and are stored in the storage device 56. These projection data include the reduction ratio 1/M, the distances La and Lb traveled by the mask 10 and the wafer 20A, the irradiation time ta of the electron beam for each small area 110, the preparation time tbs, the resist sensitivity S and the beam current density A as values necessary for the calculation of the expressions (1)–(7) explained earlier. In addition, information on the corresponding relationship between the individual small areas 110 of the mask 10 and the projection target areas 210 of the wafer 20A, i.e., the information in regard to which projection target area 210 of the wafer 20A the pattern in each small area 110 should be projected to, is also provided in advance as projection data.

Figure 7:
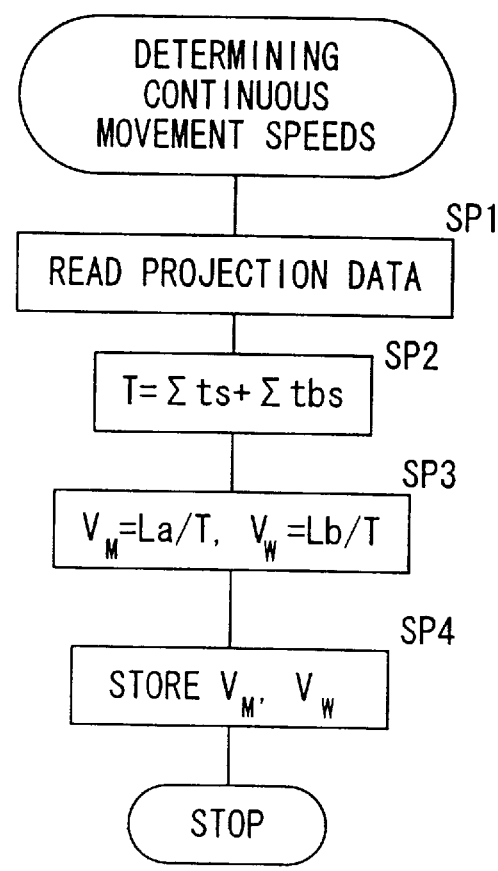
FIG. 7 is a flowchart illustrating the processing for determining the continuous movement speeds that is executed by the control device shown in FIG. 6.

When the projection data are stored in the storage device 56, the control device 50 calculates the continuous movement speeds VM and VW during projection by following the procedure shown in FIG. 7. In this processing, which is performed by using the expressions (5) and (6) explained earlier, the projection data are read in step SP1 and in step SP2 the projection time T over one continuous movement is determined using the expression (6). In step SP3, the speeds VM and VW of the continuous movement are calculated using the expression (5) and in step SP4, the speeds VM and VW are stored in the stored device to end the processing. It is to be noted that the processing described above may be performed by a device other than the projection system with the results being provided to the projection system.

When a command for projection start is issued to the control device 50 through an operation by an operator or the like, the control device 50 starts projection in conformance to the projection data. At this point, the operations of the mask stage 37 and the wafer stage 40 are controlled to ensure that the mask 10 and the wafer 20A move continuously at the speeds VM and VW, advancing in directions opposite from each other in the direction of the y axis. If a plurality of specific ranges 11 and 21 are provided in rows on the mask 10 and the wafer 20A, every time one continuous movement ends, the mask stage 37 and the wafer stage 40 are driven in steps in the direction of the y axis, which runs at a right angle to the direction of the continuous movement, and specific ranges 11 and 21 which are the object of the next projection are respectively brought into the optical field at the mask side and into the optical field at the wafer side respectively.

During one session of the continuous movement, a plurality of small areas 110 contained within a specific range 11 for which projection is to be performed are irradiated by the electron beam EB, in a specific order, and the electron beam passing through each small area 110 is conducted to a specific position on the wafer 20A. At this point, the irradiation position of the electron beam EB relative to the mask 10 is adjusted by the deflectors 36A and 36B and the pattern projection target position relative to the wafer 20A is adjusted by the deflectors 41A and 41B. In addition, in order to ensure that there is no difference in speed between the pattern image and the wafer 20A, the deflection speed determining processing shown in FIG. 8 is interrupt-executed at an appropriate cycle.

Figure 8:
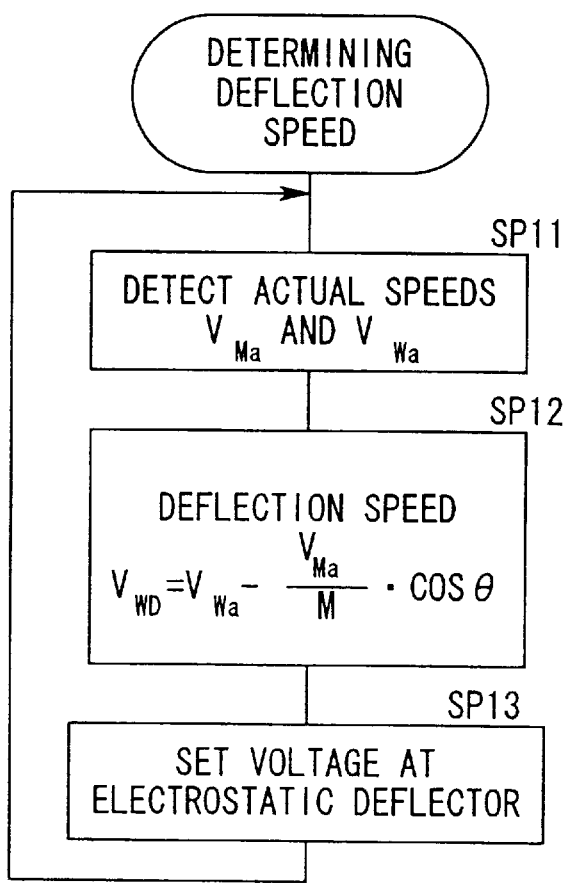
FIG. 8 is a flowchart illustrating the processing for determining the deflection speed that is executed by the control device shown in FIG. 6.

In the processing shown in FIG. 8, first, the actual the continuous movement speeds (hereafter referred to as actual speeds) VMa and VWa of the mask 10 and the wafer 20A are detected by differentiating the stage positions detected by the laser interferometer position sensors 44 and 45 in step SP11. It is to be noted that since the position sensors 44 and 45 both detect the bidirectional positions in the directions of the x axis and the y axis, any error between directions of the actual speeds VMa and VWa within the x-y plane is also determined. In step SP12, the deflection speed VWD is determined by substituting the actual speeds VMa and VWa and the directional error θ in the expression (2). Next, in step SP13, the voltage at the electrostatic deflector 43 is set to ensure that the electron beam EB is deflected in the direction of the continuous movement at the calculated deflection speed VWD, and then the operation returns to step SP11 to repeat the processing described above. It is to be noted that the processing shown in FIG. 8 may also be executed constantly by a control circuit specially provided for this purpose. The voltage control for the electrostatic deflector 43 should employ an analog method or a digital method with sufficiently fine increments.

While the speeds of the continuous movement are determined based upon the positional information detected by the laser interferometer position sensors 44 and 45 in the embodiment described above, the speeds of the mask 10 and the wafer 20A may be directly detected or the acceleration of the mask 10 and the wafer 20A may be integrated. If the errors in the continuous movement speeds of the mask 10 and the wafer 20A are small enough, the processing shown in FIG. 8 may be omitted and the deflection speed may be determined using the expression (1) in the processing shown in FIG. 7.

Second Embodiment

In the second embodiment, which is to be explained below, the blurring described in (a) and (b) below can be prevented.

(a) Blurring in the projection pattern caused by the "delay" from the time when the stage positions are detected by the position sensors 44 and 45 until the electron beam EB is deflected, and by deviation of the irradiation position of the electron beam EB on the mask 10.

(b) Blurring in the projection pattern caused by a deviation in the irradiation position of the electron beam EB on the mask 10.

Figure 9:
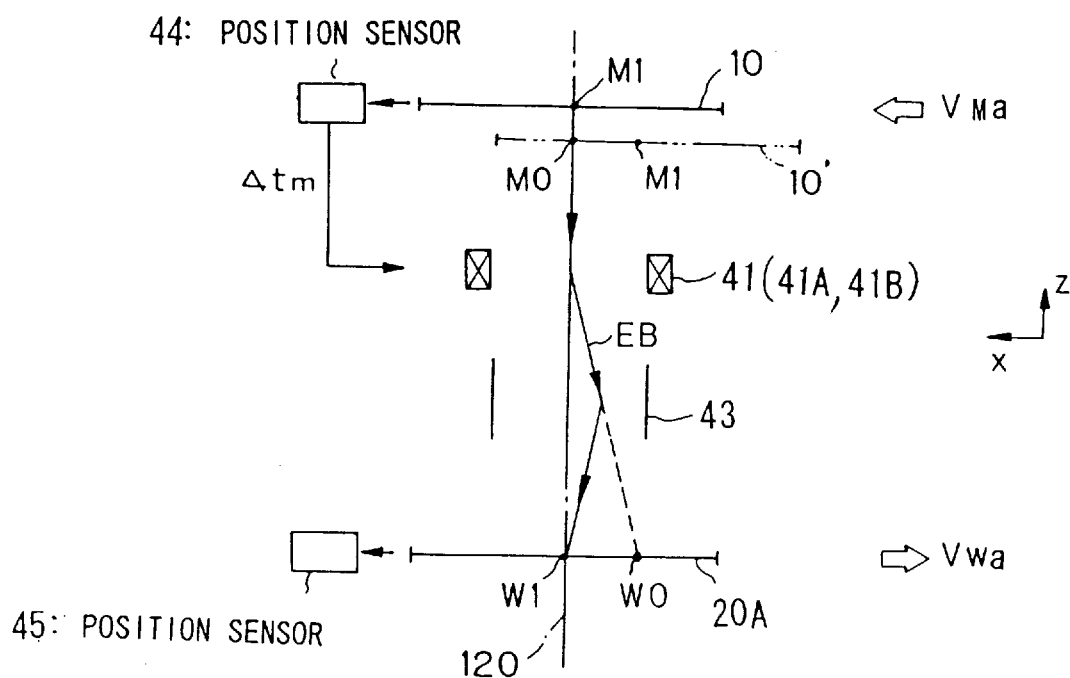
FIGS. 9A and 9B show a second embodiment of the pattern projection method according to the present invention and illustrate a positional deviation of the pattern image caused by the "delay"
Figure 9:
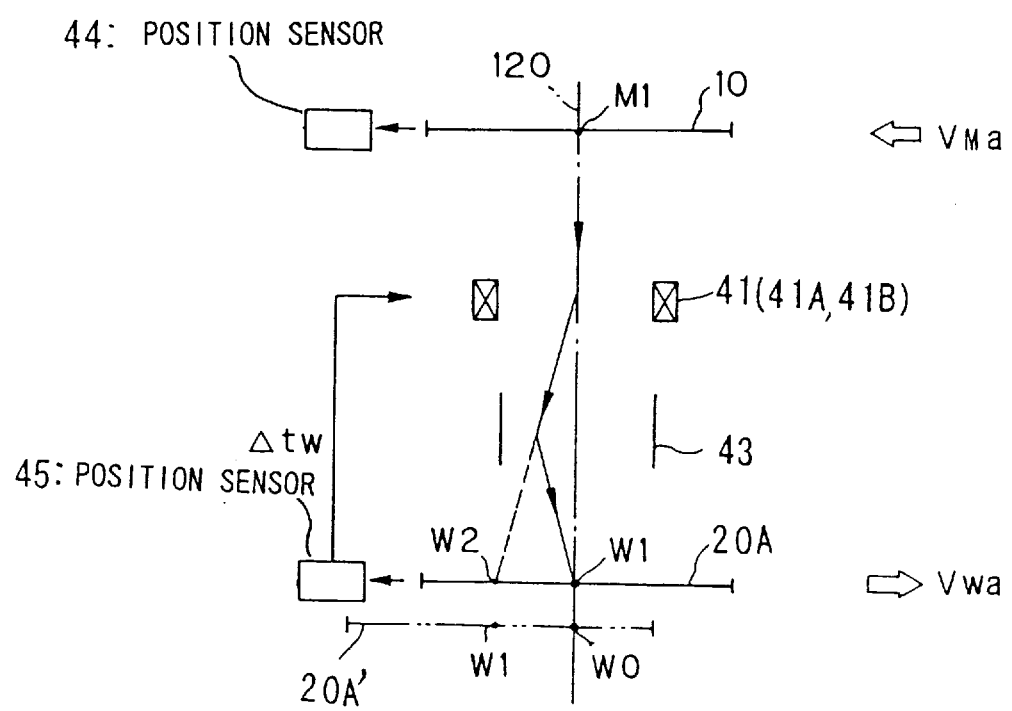

First, in reference to FIGS. 9A and 9B, a method for preventing blurring when there is a "delay" is explained. FIGS. 9A and 9B schematically show the positional relationship between the mask 10 and the wafer 20A, and a deflector 41 represents the pair of deflectors 41A and 41B shown in FIG. 6. In FIGS. 9A and 9B, portions that are not essential for the explanation have been omitted. The length of time elapsing after the positions of the stages 37 and 40 (see FIG. 6) have been detected by the position sensors 44 and 45 until the electron beam EB is deflected by the detectors 36A, 36B, 41A and 41B, i.e., the delay times are designated ΔtM and ΔtW respectively. The expression "the positions of the mask 10 and the wafer 20A are detected by the position sensors 44 and 45" is used in the following explanation since the positions of the mask 10 and the wafer 20A can be obtained by detecting the positions of the stages 37 and 40 by the position sensors 44 and 45.

FIG. 9A illustrates a case in which ΔtM is not equal to 0, and ΔtW=0. Reference number 120 indicates the position at which detection is performed by the position sensors 44 and 45 with the value detected by the position sensor 44 being M1 and the value detected by the position sensor 45 being W1 at the current time point (time point t0). However, since ΔtM is not equal to 0, the deflection of the electron beam EB by the deflector 41 is performed based upon position M0 of the mask 10 detected by the position sensor 44 at the time point (t0−ΔtM). In FIG. 9A, a chain double-dashed line 10' indicates the mask position at the time point (t0−ΔtM). In other words, the deflector 41 always responds by shifting in time (being delayed) by ΔtM. Because of this, the image of the pattern at position M1 of the mask 10, which should be projected at position W1, i.e., the projection target position on the wafer 20A, ends up being irradiated at position W0 through the path indicated with the broken line in the figure.

In the case in which ΔtM=0 and ΔtW is not equal to 0, as shown in FIG. 9B, the deflection of the electron beam EB by the deflector 43 is performed based upon position W0 of the wafer 20A detected by the position sensor 45 at the time point (t0−ΔtW). In FIG. 9B, the chain double-dashed line 20A' indicates the wafer position at time point (t0−ΔtW). In other words, the deflector 43 always responds, by shifting in time (being delayed) by ΔtW. Because of this, the pattern image which should be projected at position W1 of the wafer 20A, which is the projection target position, ends up being projected at position W2 through the path indicated with the broken line in the figure.

To deal with this problem, the electron beam EB is deflected using a deflector 43 in the following manner in the present invention. In the case illustrated in FIG. 9A, the electron beam EB is deflected in the positive direction on the x axis so that the position W1 of the wafer 20A is irradiated. Since the moving speed of the mask 10 is VMa, the distance between M1 and M0 on the mask 10 is (VMa×ΔtM), and when the reduction ratio is at 1/4, the distance between W1 and W0 on the wafer 20A will be (VMa×ΔtM)/4. In other words, the corrected deflection quantity imparted by the deflector 43 is (VMa×ΔtM)/4 when expressed as a distance on the wafer 20A.

In the case illustrated in FIG. 9B, the electron beam EB is deflected in the negative direction on the x axis so that the position W1 of the wafer 20A is irradiated. At this point, since the distance between W1 and W2 on the wafer 20A is (VWa×ΔtW), the corrected deflection quantity imparted by the deflector 43 is −(VMa×ΔtM)/4. As a result, when ΔtM is not equal to 0, and ΔtW is not equal to 0, $$\text{(corrected deflection quantity)} = (Vm \times \Delta tM)/4 - (Vw \times \Delta tW) \qquad (8)$$

By performing such corrected deflection, the pattern image is projected at a specific position on the wafer 20A, thus, preventing any blurring.

It is to be noted that on the mask 10, the direction of positions at which the exposure time point is late, i.e., to the right in the figure, is designated the positive direction, and the same principle applies to the direction of positions on the wafer 20A with the left side of the figure designated as the positive direction, the reverse of the direction on the mask 10.

Figure 10:
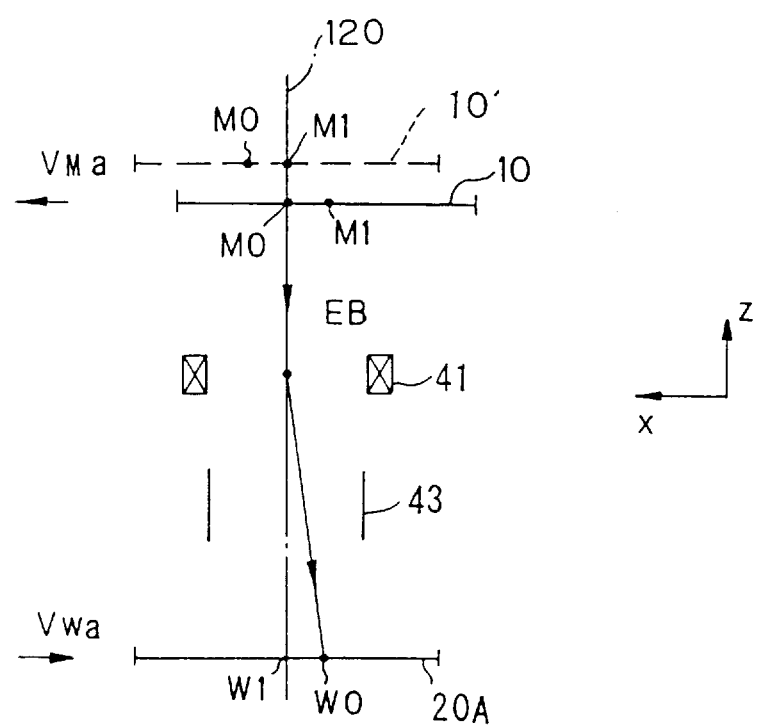
FIG. 10 illustrates the irradiation position deviation of the electron beam on a mask.

Next, in reference to FIG. 10, a method for preventing blurring of projection patterns caused by deviation of the irradiation position of the electron beam EB on the mask 10 is explained. As an example, a situation in which a irradiation position deviation occurs because the mask 10 and the wafer 20A are not in synchronization is considered. The broken line 10' indicates the mask position when the mask 10 and the wafer 20A are in synchronization. The position M1 of the mask 10' is irradiated by the electron beam EB and after passing through that position, the position W1 of the wafer 20A is irradiated by the electron beam EB.

However, if the mask 10 is not in synchronization, the position W1 of the wafer 20A is irradiated by the electron beam EB by which the position M0 of the mask 10 has been irradiated. When this happens, the irradiation position deviation on the mask 10 is $$(M0 - M1) < 0 \qquad (9)$$

and the electron beam EB is deviated in the negative direction on the mask 10. Because of this, the position W1 which is deviated by (M1−M0)/4 in the positive direction from position W0 where it should be irradiated on the wafer 20A is irradiated by the electron beam EB. As a result, blurring of the pattern image occurs.

In this case, since the direction of corrected deflection performed by the deflector 43 is the opposite from the direction of this positional deviation, the quantity of corrected deflection is $$\text{(quantity of corrected deflection)} = (M0 - M1)/4 \qquad (10)$$

By performing deflection in this manner, the image of the pattern at position M0 on the mask 10 is projected at a specific position W0 on the wafer 20A. It is to be noted that the exposure data are organized in sequence by using the wafer coordinate values for reference.

Figure 11:
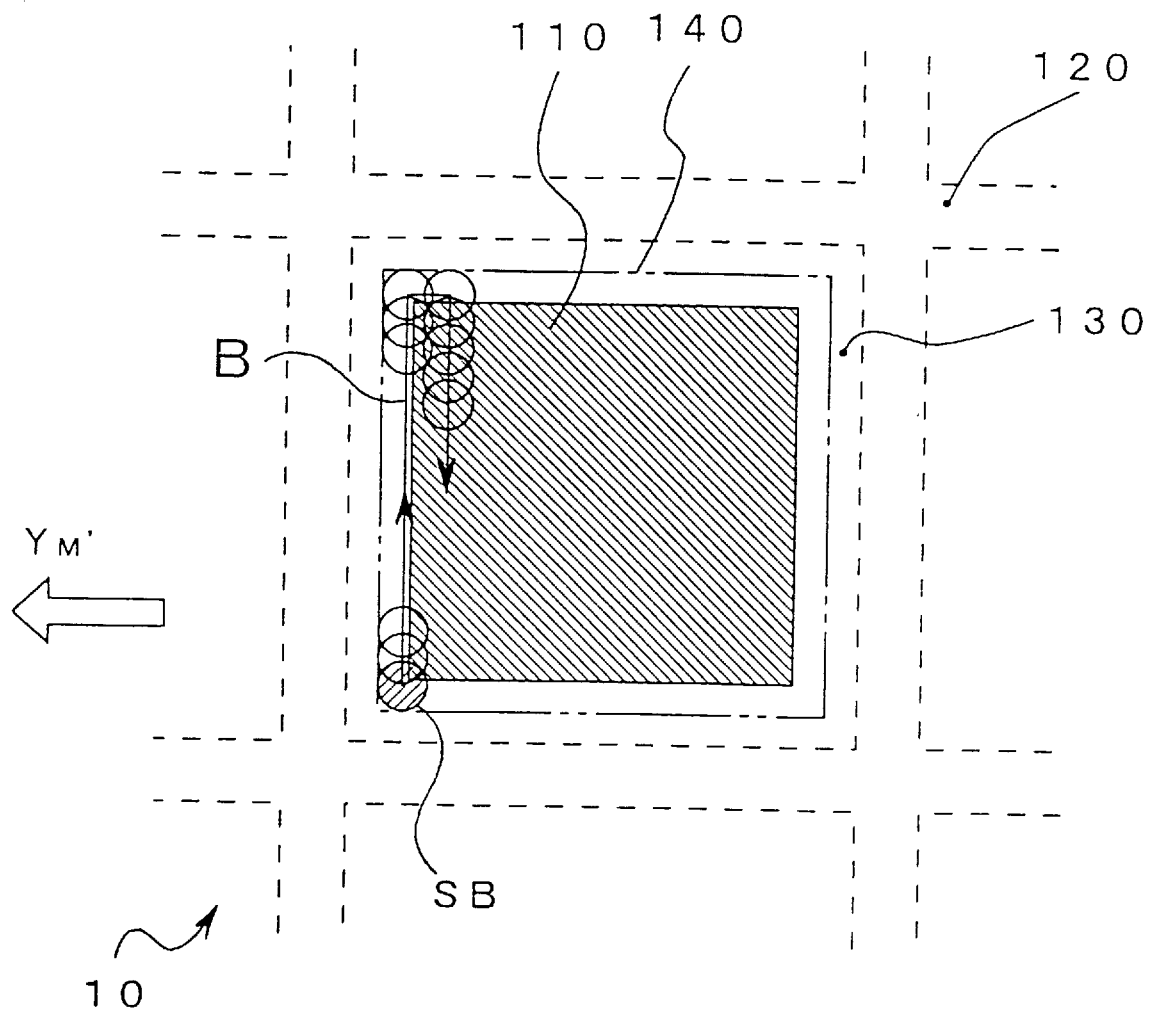
FIG. 11 illustrates the scanning with a spot beam.

While, in the projection system described above, a irradiation range 140 that includes the small areas 110 is irradiated, as shown in FIG. 2A, by the electron beam EB, which is shaped into a rectangular shape by the first aperture 34, the pattern in the small areas 110 may be projected by continuously scanning a spot beam that is highly constricted (Gaussian Beam), as shown in FIG. 11. In FIG. 11, SB indicates a spot beam, and the entirety of the irradiation range 140 is exposed by deflecting the spot beam SB in the direction running at a right angle to direction YM' to perform scanning along the path B while continuously moving the mask 10 in direction YM'.

It is to be noted that the present invention is not limited to the embodiments described above and it may be implemented in a number of forms. For instance, while in the first embodiment the stage positions detected by the laser interferometer position sensors 44 and 45 are differentiated to determine the actual speeds VMa and VWa of a mask 10 and the wafer 20A, a tacho-generator may be provided at the actuators 61 and 62 for the stages 37 and 40 to detect the actual speeds VMa and VWa by utilizing electromotive force.

In the above described explanation, the mask stage 37, the wafer stage 40, and the deflectors 36A, 36B, 41A, 41B and 43 are expressed on one coordinate, for convenience. Actually, however, the image is rotated by the electromagnetic lenses 38 and 39. Consequently, the directions of the x and y coordinate axes differ before and after the electromagnetic lenses 38 and 39.

What is claimed is:

1. A pattern projection method in which a mask and a radiation sensitive substrate are each caused to make one or more continuous movements to perform projection and, while said one continuous movement of said mask and one continuous movement of said radiation sensitive substrate are being performed, a plurality of small areas contained within a specific range of said mask are irradiated in time sequence by a charged particle beam to selectively project a pattern in each of said small areas onto one of a plurality of projection areas contained within a specific range of said radiation sensitive substrate, wherein:

(a) a required time for pattern projection for said specific range of said mask from beginning to end is determined based upon an optimal value for irradiation time of said charged particle beam for each of said plurality of small areas of said mask and a required time for projection preparation for each of said small areas;

(b) speeds of said continuous movements of said mask and said radiation sensitive substrate are set to ensure that said mask moves from a state in which one end of said specific range of said mask is present within a mask side optical field of a projection system to a state in which another end of said specific range of said mask is present within said mask side optical field, and said radiation sensitive substrate moves from a state in which one end of said specific range of said radiation sensitive substrate is present in a radiation sensitive substrate side optical field of said projection system to a state in which another end of said specific range of said radiation sensitive substrate is present within said radiation sensitive substrate side optical field, within said required time that has been determined; and (c) during projection exposure, said charged particle beam to be conducted from said mask to said radiation sensitive substrate is deflected in said direction of said continuous movements at a specific speed so that a relative speed of an image of said pattern which is projected onto said radiation sensitive substrate and said radiation sensitive substrate becomes substantially zero.

2. A pattern projection method according to claim 1, wherein:

during said continuous movements of said mask and said radiation sensitive substrate, said speeds of said continuous movements or a physical quantity related to said speed is detected and, based upon values thus detected, a speed of deflection of said charged particle beam in said direction of said continuous movements is controlled.

3. A pattern projection method in which a radiation sensitive substrate is caused to make one or more continuous movements to perform projection and during said one continuous movement of said radiation sensitive substrate a plurality of small areas contained within a specific range of a mask are irradiated by a charged particle beam to selectively project a pattern in each of said small areas onto one of a plurality of projection areas contained within a specific range of said radiation sensitive substrate, wherein:

(a) a required time for pattern projection for said specific range of said radiation sensitive substrate from beginning to end is determined based upon an optimal value for a duration of irradiation of said charged particle beam for each of said projection target areas of said radiation sensitive substrate and a time required for projection preparation for each of said projection target areas;

(b) a speed of said continuous movement of said radiation sensitive substrate in which one end of said specific range of said radiation sensitive substrate is present within an optical field of a projection system at said radiation sensitive substrate side to a state in which another end of said specific range of said radiation sensitive substrate is present within said optical field at said radiation sensitive substrate side within said required time that has been determined; and (c) during projection exposure, said charged particle beam to be conducted from said mask to said radiation sensitive substrate is deflected in a direction of said continuous movement at a specific speed so that a relative speed of an image of said pattern which is projected onto said radiation sensitive substrate and said radiation sensitive substrate becomes substantially zero.

4. A pattern projection method according to claim 3, wherein:

during said continuous movement of said radiation sensitive substrate, a speed of said continuous movement or a physical quantity related to said speed is detected and, based upon a value thus detected, a speed of deflection of said charged particle beam in said direction of said continuous movement is controlled.

5. A pattern projection method according to claim 3, wherein:

a pattern in one small area of said mask is projected onto a plurality of specific projection target areas contained within said specific range of said radiation sensitive substrate.

6. A pattern projection method according to claim 5, wherein:

during said continuous movement of said radiation sensitive substrate, a speed of said continuous movement or a physical quantity related to said speed is detected and, based upon a value thus detected, a speed of deflection of said charged particle beam in said direction of said continuous movement is controlled.

* * * * *